United States Patent
Beer et al.

(10) Patent No.: US 9,553,208 B2
(45) Date of Patent: Jan. 24, 2017

(54) CURRENT SENSOR DEVICE

(71) Applicant: Infineon Technologies AG, Neubiberg (DE)

(72) Inventors: Gottfried Beer, Nittendorf (DE); Volker Strutz, Tegernheim (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/027,710

(22) Filed: Sep. 16, 2013

(65) Prior Publication Data

US 2015/0076636 A1    Mar. 19, 2015

(51) Int. Cl.
| | | |
|---|---|---|
| *H01L 29/82* | (2006.01) | |
| *G01R 19/00* | (2006.01) | |
| *G01R 33/00* | (2006.01) | |
| *H01L 21/56* | (2006.01) | |
| *H01L 23/29* | (2006.01) | |
| *H01L 23/528* | (2006.01) | |

(52) U.S. Cl.
CPC ............ *H01L 29/82* (2013.01); *G01R 19/0092* (2013.01); *G01R 33/0047* (2013.01); *G01R 33/0052* (2013.01); *H01L 21/561* (2013.01); *H01L 23/293* (2013.01); *H01L 23/528* (2013.01); *H01L 2224/19* (2013.01)

(58) Field of Classification Search
CPC ............ G01R 19/0092; G01R 33/0052; G01R 33/0047
See application file for complete search history.

(56) References Cited

U.S. PATENT DOCUMENTS

| | | | | |
|---|---|---|---|---|
| 4,604,535 | A | * | 8/1986 | Sasayama et al. ............ 327/432 |
| 5,041,780 | A | * | 8/1991 | Rippel ....................... 324/117 H |
| 6,462,531 | B1 | | 10/2002 | Ohtsuka |
| 2008/0136009 | A1 | * | 6/2008 | Theuss et al. ................ 257/690 |
| 2009/0153138 | A1 | * | 6/2009 | Theuss ......................... 324/251 |
| 2013/0055052 | A1 | * | 2/2013 | Kaeriyama ................... 714/799 |
| 2013/0320471 | A1 | * | 12/2013 | Luan ................ H01L 27/14618 257/432 |
| 2014/0015123 | A1 | * | 1/2014 | Bowles et al. ................ 257/737 |

FOREIGN PATENT DOCUMENTS

| | | |
|---|---|---|
| CN | 102236042 A | 11/2011 |
| CN | 102331519 A | 1/2012 |
| CN | 102856303 A | 1/2013 |
| DE | 102011003998 A1 | 8/2011 |

OTHER PUBLICATIONS

Ausserlechner, U., et al., "Current Sensor Device." U.S. Appl. No. 13/939,113, filed Jul. 10, 2013.

* cited by examiner

*Primary Examiner* — Marc Armand
*Assistant Examiner* — Sue Tang
(74) *Attorney, Agent, or Firm* — Murphy, Bilak & Homiller, PLLC

(57) ABSTRACT

A current sensor device for sensing a measuring current includes a semiconductor chip having a magnetic field sensitive element. The current sensor device further includes an encapsulant embedding the semiconductor chip. A conductor configured to carry the measuring current is electrically insulated from the magnetic field sensitive element. A redistribution structure includes a first metal layer having a first structured portion which forms part of the conductor.

19 Claims, 6 Drawing Sheets

CURRENT SENSOR DEVICE

TECHNICAL FIELD

Embodiments described herein generally relate to the technique of current sensing, and more particularly to magnetic current sensor devices.

BACKGROUND

Magnetic current sensors detect the magnetic field generated by a current. A magnetic current sensor device may include a conductor and a semiconductor chip configured to sense the magnetic field produced by the current flowing through the conductor. Packaging also involves providing an electrical isolation between the semiconductor chip and the conductor. Devices providing high performance in view of sensitivity, high break down voltages, lifetime, etc. at low expenses are desirable.

SUMMARY

According to an embodiment of a current sensor device for sensing a measuring current, the current sensor device comprises a semiconductor chip comprising a magnetic field sensitive element, an encapsulant embedding the semiconductor chip, and a conductor configured to carry the measuring current, the conductor being electrically insulated from the magnetic field sensitive element. The current sensor device further comprises a redistribution structure comprising a first metal layer. The first metal layer comprises a first structured portion which forms part of the conductor.

According to another embodiment of a current sensor device for sensing a measuring current, the current sensor device comprises a semiconductor chip having a first main surface containing a magnetic field sensitive element and a redistribution structure extending over the first main surface of the semiconductor chip. The redistribution structure comprises a first metal layer configured to form a conductor for carrying the measuring current and an organic insulating layer extending between the first main surface of the semiconductor chip and the conductor.

According to an embodiment of a method of manufacturing a current sensor device for measuring a current flowing through a conductor, the method comprises: placing at least two semiconductor chips each comprising a magnetic field sensitive element on a temporary carrier; covering the at least two semiconductor chips with an encapsulation material to form an encapsulant; removing the temporary carrier from the encapsulant; applying an organic insulating layer over a main surface of the at least two semiconductor chips after the main surface is released from the temporary carrier; applying a first metal layer over the organic insulating layer; structuring the first metal layer to comprise first structured portions, each first structured portion forming part of the conductor of the current sensor device; and singulating the at least two semiconductor chips.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of embodiments. Other embodiments and many of the intended advantages of embodiments will be readily appreciated as they become better understood by reference to the following detailed description. The elements of the drawings are not necessarily drawn to scale relative to each other. Like reference numerals designate corresponding similar parts.

DETAILED DESCRIPTION

Figure 1:
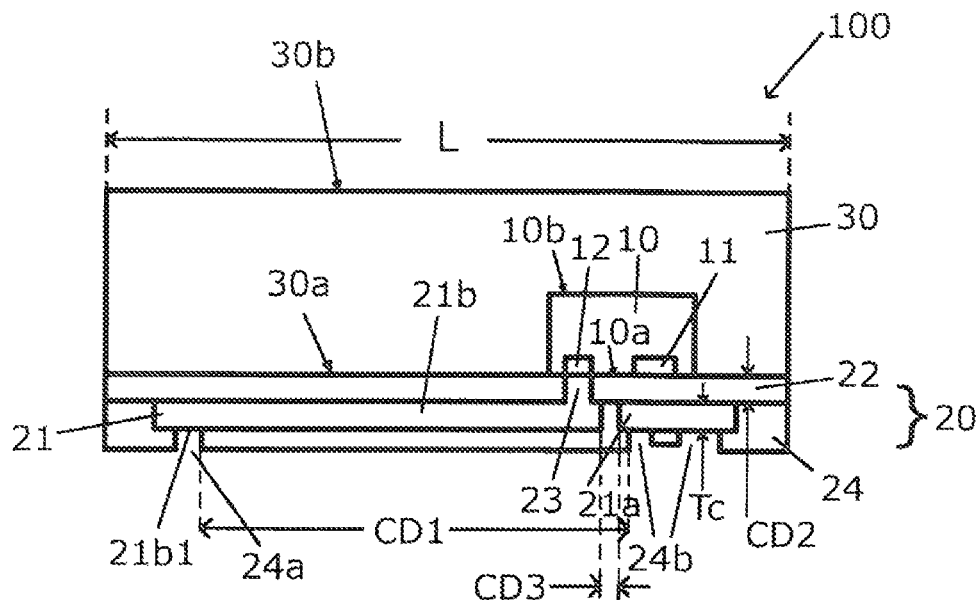
FIG. 1 schematically illustrates a cross-sectional view of an exemplary current sensor device.

In the following detailed description, reference is made to the accompanying drawings, which form a part thereof, and in which is shown byway of illustration specific embodiments in which the invention may be practiced. In this regard, directional terminology, such as "upper", "lower", "top", "bottom", "left", "right", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. Further, as employed in this specification, the terms "bonded", "applied", "attached", "connected", "coupled", "electrically connected/electrically coupled", "covered" or derivatives thereof are not meant to mean that the elements or layers must directly be contacted together; intervening elements or layers may be provided between the "bonded", applied", "attached", "connected", "coupled", "electrically connected/ electrically coupled" elements or the "covered" and the covering elements or layers, respectively. However, in accordance with the disclosure, the above-mentioned terms may, optionally, also have the specific meaning that the elements or layers are directly contacted together, i.e. that no intervening elements or layers are provided between the "bonded", "applied", "attached", "connected", "coupled", electrically connected/electrically coupled" or the "covered" and the covering elements or layers, respectively.

The current sensor devices described below contain one or more semiconductor chip(s) comprising at least one magnetic field sensitive element. The semiconductor chip(s) may be manufactured by various technologies and may include, for example, integrated electrical, electro-optical, or logical circuits, MEMS (Micro-Electro-Mechanical Systems), switches, antennas, and/or passives.

The semiconductor chip may have electrodes (or contact elements or contact pads) which allow electrical contact to be made with relevant external contact element(s) and/or internal elements of the embedded circuits such as, e.g., the magnetic field sensitive element. The electrodes may be arranged on one main surface of the semiconductor chip, e.g. on the main surface at which the magnetic field sensitive element is located or, e.g., if through vias (e.g. TSV: through-silicon vias) are used, at the opposite main surface. The semiconductor chip may be mounted in a flip chip orientation with the main surface at which the magnetic field sensitive element is located facing an electrical redistribution structure. Electrical redistribution structures as referred to herein are also termed RDL (redistribution layers) in the art.

The current sensor devices described herein contain an electrical conductor. The electrical conductor forms part of an electrical redistribution structure extending at the bottom of the current sensor device. That is, at least one metal layer of the electrical redistribution structure may be configured to comprise a first structured portion which forms part of the electrical conductor. The at least one metal layer or, e.g., another metal layer of the electrical redistribution structure may further comprise a second structured portion which comprises an electrical interconnect to couple input/output or power supply electrodes of the semiconductor chip to external terminals of the current sensor device.

The electrical redistribution structure may further comprise an organic insulating layer extending between the semiconductor chip and the metal layer of the electrical redistribution structure. The organic insulating layer may provide for a vertical dielectric strength (measured in the direction of the thickness of the organic insulating layer) equal to or greater than 5 kV/mm, 20 kV/mm, 50 kV/mm, 100 kV/mm or 250 kV/mm.

The current sensor devices described herein may comprise an encapsulant in which the semiconductor chip is embedded. The encapsulant may comprise or be a molded plastic part, in particular an integral molded plastic part. Byway of example, the encapsulant may, e.g., comprise or be made of at least one of a filled or unfilled mold material, a filled or unfilled thermoplastic material, or a filled or unfilled thermoset material. Various techniques may be employed to form the molded plastic part, for example compression molding, injection molding, powder molding, or liquid molding.

In other embodiments, the encapsulant comprises or is formed of a laminate. The laminate may. e.g., comprise or be made on the basis of, e.g., epoxy resin, PU (polyurethane) or polytetrafluoroethylene, and may include reinforcement means such as, e.g., aramid fibers, glass fibers or carbon fibers. More specifically, the encapsulant may. e.g., comprise or be made of a filled or unfilled laminate, a fiber-reinforced laminate, a fiber-reinforced polymer laminate, and a fiber-reinforced polymer laminate with filler particles.

The encapsulant may have walls defining the periphery of the current sensor device, i.e. the encapsulant may at least partly (e.g. top wall and/or side walls) define the outer shape of the current sensor device.

FIG. 1 illustrates an exemplary current sensor device 100. The current sensor device 100 comprises a semiconductor chip 10 including at least one magnetic field sensitive element 11. The current sensor device 100 further comprises a redistribution structure 20. The redistribution structure 20 comprises a first metal layer 21 and may comprise an organic insulating layer 22 extending between the semiconductor chip 10 and the first metal layer 21 of the redistribution structure 20. A first (bottom) main surface 10*a* of the semiconductor chip 10 may face the redistribution structure 20 and may, e.g., be in direct contact to the redistribution structure 20.

The first metal layer 21 is structured to at least partly form a conductor to carry the measuring current. More specifically, the first metal layer 21 comprises a first structured portion 21*a* which forms part of the conductor. The first structured portion 21*a* of the first metal layer 21 may define the outline (footprint) of the conductor. It is possible that the conductor is exclusively formed by the first structured portion 21*a* of the first metal layer 21, i.e. is identical therewith. The magnetic field sensitive element 11 is configured to sense a magnetic field which is created by a current flowing through the conductor 21*a*.

The first metal layer 21 may further be configured to comprise at least one second structured portion 21*b* forming an electrical interconnect. The electrical interconnect may be configured to electrically couple a sensor chip electrode 12 of the semiconductor chip 10 to an external terminal of the current sensor device 100. By way of example, as illustrated in subsequent figures, an external terminal of the current sensor device 100 may, e.g., be a solder ball which is attached to an exposed area 21*b*1 of the second structured portion 21*b* of the first metal layer 21. Solder balls may as well be attached to an exposed area of 21*a*.

The first metal layer 21 may be applied by deposition methods such as, e.g., sputtering and/or galvanic plating. The thickness Tc of the first structured portion 21*a* may, e.g., be identical to the thickness of the first metal layer 21, e.g. to the thickness of the second structured portion 21*b*. In other embodiments, as will be explained in more detail further below, the first structured portion 21*a* may be a reinforced portion of the first metal layer 21 having a thickness Tc greater than a thickness of the first metal layer outside of the first structured portion 21*b*. By way of example, Tc may be equal to or greater than 5 μm, 10 μm, 20 μm, 30 μm, or 50 μm. By way of example, Tc may be equal to or smaller than 80 μm, 40 μm, 30 μm, 25 μm, 20 μm, or 10 μm.

The current sensor device 100 may further comprise an encapsulant 30 embedding the semiconductor chip 10. The encapsulant 30 may, e.g., be made of a mold material or a laminate. The encapsulant 30 may partly or completely cover the side walls of the semiconductor chip 10 and may partly or completely cover a second (top) main surface 10*b* of the semiconductor chip 10 arranged opposite to the first (bottom) main surface 10*a* of the semiconductor chip 10. The first main surface 10*a* may remain uncovered by the encapsulant 30.

The magnetic field sensitive element 11 may be located on the first main surface 10a of the semiconductor chip 10. Further, the at least one chip electrode 12 may be located on the first main surface 10a of the semiconductor chip 10. The chip electrode 12 may, e.g., be an input/output (I/O) electrode or a power supply electrode of the semiconductor chip 10.

The encapsulant 30 may have a first main surface 30a facing the redistribution structure 20 and a second main surface 30b opposite to the first main surface 30a. The first main surface 30a of the encapsulant 30 and the first main surface 10a of the semiconductor chip 10 may form a common planar surface. Planar may mean that the topology is below 100 µm, especially below 15 µm. The redistribution structure 20 and, more particularly, e.g. the organic insulating layer 22 thereof may be applied to this common planar surface. That is, the organic insulating layer 22 may, e.g., cover both the first main surface 10a of the semiconductor chip 10 and the first main surface 30a of the encapsulant 30. The first main surface 30a of the encapsulant 30 and the first main surface 10a of the semiconductor chip 10 may be flush with each other. The organic insulating layer 22 may, e.g., be in direct contact to the first main surface 30a of the encapsulant 30 and/or to the first main surface 10a of the semiconductor chip 10.

The encapsulation material of which the encapsulant 30 is made may be a duroplastic or thermosetting material. The encapsulation material may, e.g., be a molding material. It may. e.g., be based on an epoxy material. It may, e.g., contain a filling material consisting of small particles of glass ($SiO_2$) or other electrically insulating mineral filler materials like $Al_2O_3$, AlN, SiN, and/or anorganic or organic filler materials. The encapsulation material may be based on a polymer material. By e.g. curing the encapsulation material, the encapsulant 30 is formed. The encapsulant 30 provides stability, rigidity and protection against environmental impact (chemical, mechanical, radiation, etc.) to the semiconductor chip 10. Various techniques may be employed to cover the semiconductor chips 10 with the encapsulation material. The encapsulation material (mold material) may, for example, be applied by compression molding, injection molding, granulate molding, powder molding or liquid molding.

Further, the encapsulant 30 may be a laminate. In this case, the encapsulation material may be provided by an adhesive foil which is laminated over the semiconductor chip 10 to form the encapsulant 30. The adhesive foil may comprise an encapsulation material made of one or more of, e.g., epoxy, acrylate or polyimide. Specific examples of materials which may be used for the adhesive foil are PEEK (polyetheretherketone), PPS (polyphenylsulphone), PSU (polysulfone), PEI (polyetherimide), PAI (polyamidimide) and LCP (liquid crystalline polymers). The adhesive foil may be reinforced with glass fibers, carbon fibers, nanotubes etc. The adhesive foil may contain anorganic or/and organic filler particles.

The organic insulating layer 22 may, e.g., be made of a photostructurable resist or a non-photostructurable material. More specifically, the material of the organic insulating layer 22 may, e.g., be formed of or contain polyimide, silicone, epoxy, polyurethane, acrylonitrile butadiene styrene (ABS), polybenzoxazole, benzocyclobutene (BCB), polynorbornene, phenolic resins, cyclic olefinic (co)polymers, aromatic hydrocarbons, parylene, polyphenylenebenzobisoxazole (PBS), ormocere or other appropriate materials. The material of the organic insulating layer 22 may, e.g., be entirely made of one or more of the aforementioned materials or may be made of a combination of one or more of these materials and other materials. The organic insulating layer 22 may contain filler particles or may be reinforced as described for the encapsulation material.

The organic insulating layer 22 may be provided with one or more through-connections 23 running through the organic insulating layer 22. The through-connection(s) 23 may electrically connect the chip electrode(s) 12 to the second structured portion 21b of the first metal layer 21. As will be explained in greater detail further below, through-connections similar to the ones shown in FIG. 1 may also be provided to electrically connect an additional electrical component accommodated in the encapsulant 30 to the first metal layer 21 (or to another metal layer) of the redistribution structure 20. By way of example, the organic insulating layer 22 may, e.g., be a photosensitive dielectric (such as e.g. polyimide, polybenzoxazole, BCB, epoxy, or a photoresist such as, e.g., SU8, which is epoxy-based). In this case, the organic insulating layer 22 may be structured by photolitography.

The organic insulating layer 22 may instead be a non-photosensitive material. In this case, the organic insulating layer 22 may, e.g., be structured by laser ablation or other material removing techniques.

The organic insulating layer 22 may serve to provide for galvanic isolation between the semiconductor chip 10 with the magnetic field sensitive element 11, the conductor carrying the measuring current (which includes or corresponds to the first structured portion 21a of the first metal layer 21) and, e.g., the second structured portion 21b (in combination with e.g. a polymer layer 24, which will be described in more detail further below). Thus, the thickness of the organic insulating layer 22 may define a vertical creepage distance CD2 of the current sensor device 100. CD2 may be equal to or greater than 5 µm, 10 µm, 20 µm, 30 µm, or 40 µm. On the other hand, CD2 may be equal to or smaller than 70 µm, 60 µm, 50 µm, 40 µm, 30 µm, and 20 µm. The galvanic isolation (breakdown voltage) provided by the organic insulating layer 22 increases with increasing CD2 and depends on the dielectric strength of the material of the organic insulating layer 22.

The redistribution structure 20 may further comprise a first polymer layer 24 applied over the first metal layer 21 at a side thereof facing away from the semiconductor chip 10. The first polymer layer 24 may serve as a solder stop layer in order to define openings for solder ball attach. A first opening 24a in the first polymer layer 24 exposes the area 21b1 of the second structured portion 21b of the first metal layer 21. Further, a plurality of openings 24b in the first polymer layer 24 may expose areas of the conductor, e.g. areas of the first structured portion 21a of the first metal layer 21 which is included in the conductor. The openings 24a, 24b in the first polymer layer 24 may define locations where external terminals (e.g. solder balls) of the current sensor device 100 may be applied.

By way of example, the overall length L of the current sensor device 100, as measured between opposed side-walls thereof, may be equal to or less than or greater than 8 mm, 5 mm, 4 mm, or 3 mm. The overall width W of the current sensor device 100, as measured in perpendicular direction to the length L (see FIG. 2), may be equal to or less than or greater than 8 mm, 5 mm, 4 mm, or 3 mm.

A horizontal creepage distance CD1 may be defined by a minimum distance between external terminals at the first structured portion 21a and external terminals at the second structured portion 21b, that is e.g. by a minimum distance between the low voltage side opening(s) 24a and the high voltage side opening(s) 24b. CD1 relates to or provides a voltage class for a galvanic separation between the low voltage side and the high voltage side of the current sensor device 100. Depending on the required minimum breakdown voltage, the horizontal creep distance CD1 may be specified to be equal to or greater than 1 mm, 2 mm, 3 mm, 4 mm, 5 mm, 6 mm, or 8 mm corresponding to voltage classes.

The electrical redistribution structure 20 and, in particular the organic insulating layer 22, the first metal layer 21 and, e.g., the first polymer layer 24 may extend over the full area of the first main surface 30a of the encapsulant 30 or may extend over at least more than 90%, 80%, 70%, 60% of the area of the first main surface 30a. Further, the thickness of each of these layers may, e.g., be constant.

A further horizontal breakdown voltage across creepage distance CD3 is given by the minimum distance between the first structured portion 21a and the second structured portion 21b and may, e.g., be in the same range as the vertical breakdown voltage. More specifically, the vertical breakdown voltage (as determined by CD2) may be in the range between ⅓ and 3 times the horizontal breakdown voltage across CD3. The vertical breakdown voltage across CD2 of the organic insulating layer 22 may be equal to or greater than 10 V, 100 V, 200 V, 400 V, 600 V, 1 kV, 2.5 kV, 4.5 kV, or 10 kV. The organic insulating layer 22 may be provided to guarantee such specified vertical breakdown voltage of the current sensor device 100 during lifetime of the device 100. As already mentioned, the horizontal creepage distance CD1 may correspond to the assigned voltage class.

The specified breakdown voltage to be guaranteed may depend on the application in which the current sensor device 100 is to be used. By way of example, the current sensor device 100 may be configured to measure AC or DC currents. The current sensor device 100 may be configured for use as a fault sensing device, a current control device, a uni-directional or bi-directional current sensing or measuring device, a battery monitoring device, etc. By way of example, the current sensing device 100 may be used for one or more of these tasks in, e.g., 110 V, 220 V or 410 V electric supply networks and/or inverter circuits. The current sensor device 100 may, e.g., be used to monitor battery charging conditions or battery charging/discharging cycles in various applications such as, e.g., in hybrid motor vehicles which typically use voltages in the range between 400 V and 600 V.

Figure 2:
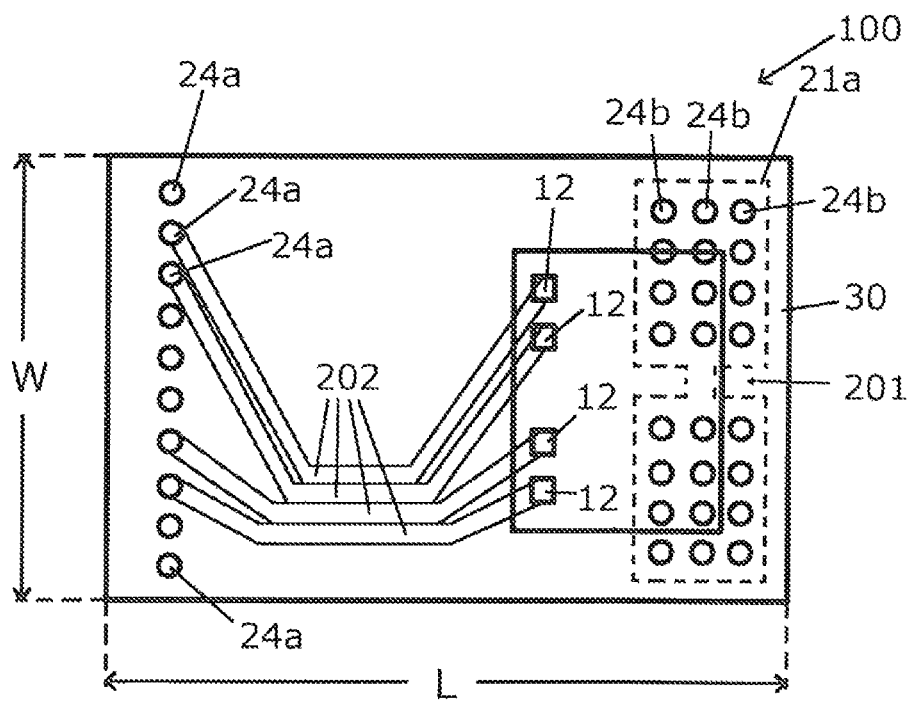
FIG. 2 schematically illustrates a top view of the current sensor device of FIG. 1 in a semi-transparent representation.

FIG. 2 illustrates a top view of the current sensor device 100 illustrated in a semi-transparent representation. The conductor comprising the first structured portion 21a of the metal layer 21 may have a constriction 201 in the direction of the current flow (i.e. the direction of width W). The current to be sensed flows through the conductor and passes the constriction 201. The constriction 201 may be placed in a vertical projection beneath the magnetic field sensitive element 11.

The chip electrodes 12 may be placed under a certain distance from the at least one magnetic field sensitive element 11. By way of example, the chip electrodes 12 may be provided outside of a keep-out zone (KOZ) of about 0.3 to 0.8 mm around the magnetic field sensitive element 11 (which may approximately be aligned with the center of the constriction 201).

As it is apparent in FIG. 2, a plurality of conductor paths 202 may be arranged to connect the chip electrodes 12 to low voltage side external terminals (not shown) of the current sensor device 100, which may be located in the openings 24a of the first polymer layer 24. The external terminals/openings 24a may e.g. be arranged in a column extending near to the edge of the encapsulant 30. The conductor paths 202 may be formed by a plurality of second structured portions 21b of the first metal layer 21. If a multiple redistribution structure 20 is used (see e.g. FIG. 6), it may also be formed by structured portions of another metal layer.

By way of example, the conductor paths 202 may be routed in a U-shape to avoid a central zone of the current sensor device 100. As will be explained in more detail in the following, this central zone may be used for additional components to be integrated in the current sensor device 100. Further, conductor paths 202 might be also connected to such additional components.

Further, as can be seen in FIG. 2, a plurality of openings 24b, e.g. more than 10, may be provided in the first polymer layer 24 to provide for an array of external terminals on the high voltage side of the current sensor device 100. The plurality of openings 24b in the first polymer layer 24, e.g. more than 10, may be arranged in one or more columns extending along and distributed across the conductor. By the way the openings 24b in the first polymer layer 24 for the external terminals might be arranged irregular in locations and shapes in view of current density, low ohmic resistance and/or magnetic field formation, and also in combination with the shape of the constriction 201.

Figure 3:
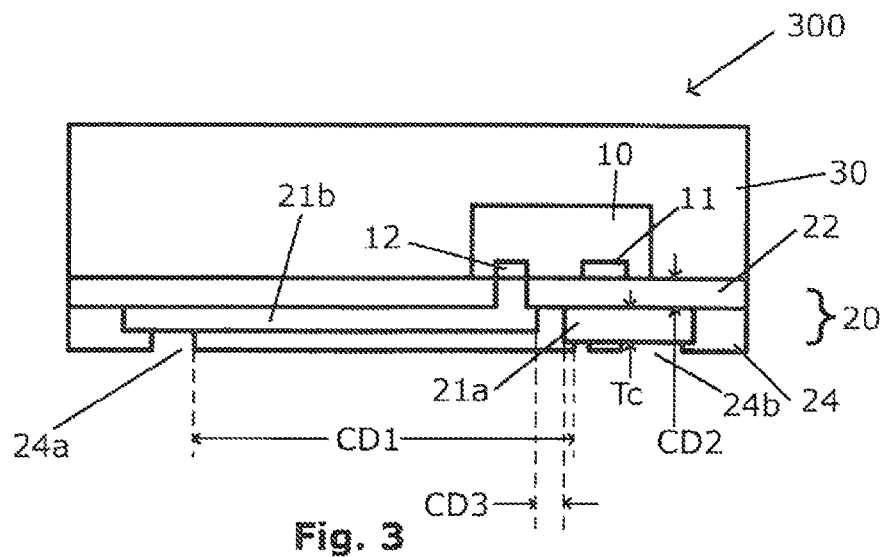
FIG. 3 schematically illustrates a cross-sectional view of an exemplary current sensor device provided with a reinforced current conductor integrated in an (electrical) redistribution structure.

FIG. 3 illustrates a cross-sectional view of an exemplary current sensor device 300. The current sensor device 300 may be identical to the current sensor device 100 except that the conductor is a reinforced part of the first metal layer 21. That is, the thickness Tc of the first structured portion 21a may be greater than the thickness of the second structured portion 21b (which may form the conductor path 202 connecting e.g. chip electrode 12 to the low voltage side of the device). The reinforcement of the first structured portion 21a may, e.g., be obtained by galvanic plating. Openings 24b of the first polymer layer 24 expose corresponding areas of the reinforced first structured portion 21a in order to connect external terminals (e.g. solder balls) to the conductor of the current sensor device 300.

The current sensor device 300 provided with a reinforced current conductor contained in the electrical redistribution structure 20 allows to sense or measure currents higher than the currents which could be sensed or measured without current conductor reinforcement by virtue of reduced ohmic resistance/losses without affecting the feature sizes of the second structure portion 21b.

Figure 4:
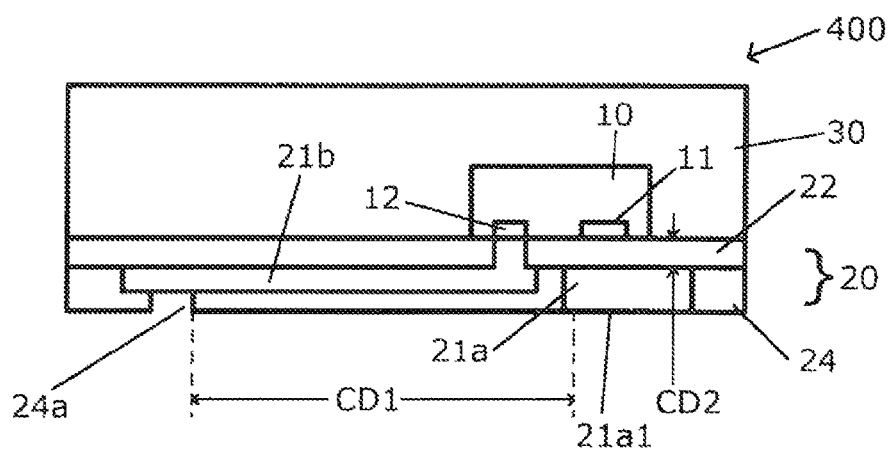
FIG. 4 schematically illustrates a cross-sectional view of an exemplary current sensor device provided with an exposed current conductor integrated in an (electrical) redistribution structure.

FIG. 4 illustrates an exemplary current sensor device 400. The current sensor device 400 may be identical to the current sensor device 300 except that the lower surface 21a1 of the reinforced current conductor is completely exposed. That way, optimum heat removal may be obtained, e.g. by coupling the lower surface 21a1 of the reinforced current conductor to a printed circuit board (not shown) which may, e.g., be thermally optimized by comprising thermal vias. The first polymer layer 24 may still be used as a solder stop layer at the low voltage side of the current sensor device 400. In a further embodiment, the lower surface 21a1 of the reinforced current conductor might be connected directly to clips (not shown) by e.g. soldering or ultrasonic welding etc. The clips might be prepared to allow simple plugging of the power-in/out-wiring.

Figure 5:
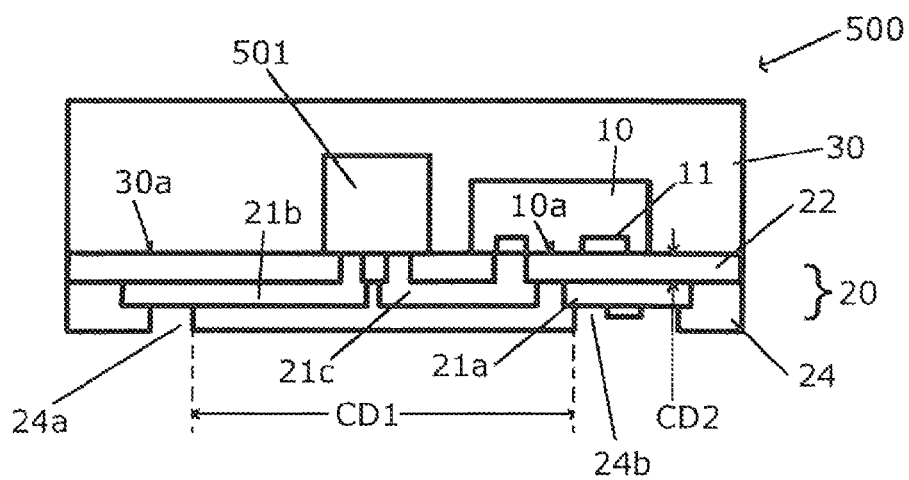
FIG. 5 schematically illustrates a cross-sectional view of an exemplary current sensor device including an electrical component.

FIG. 5 illustrates an exemplary current sensor device 500. In view of the semiconductor chip 10, the electrical redistribution structure 20 and the encapsulant 30, the current sensor device 500 may be designed similar to the current sensor device 100 and reference is made to the description herein in order to avoid reiteration. Further, the current sensor device 500 may comprise at least one further electrical component 501. The electrical component 501 may comprise an active semiconductor device, diode, switches, or any passive device.

The electrical component 501 may be electrically coupled to the electrical redistribution structure 20. More specifically, the electrical component 501 may be electrically coupled to the second structured portion 21b of the first metal layer 21. Further, the electrical component 501 may be electrically coupled to the chip electrode 12 of the semiconductor chip 10 via, e.g., a third structured portion 21c of the first metal layer 21.

The electrical component 501 may be a packaged module. By way of example, the electrical component may be an IPD (integrated passive device), a SiP (system-in-package), a controller, a microprocessor, a wireless communication chip, in particular a near field communication (NFC) chip, etc.

An IPD uses a semiconductor substrate such as, e.g., silicon or the like and implements one or more passive components (impedance, resistor, capacitor) in the substrate. By way of example, impedance matching circuits, harmonic filters, couplers, etc. may be realized by IPD technology, e.g. for wireless communication purposes.

A SiP contains a number of integrated circuits enclosed in a single module (package). The SiP may perform most or all of the functions of an electronic system, e.g. evaluating function, monitoring function, measurement function, controlling function, and near field communication function. By way of example, e.g. a SiP may be used as an electrical component 501 to realize an "intelligent" current sensor device 500 which allows for evaluation of the measured quantity (current) and, e.g., for controlling external devices on the basis of the evaluation results, or for communicating the evaluation results, e.g. by wireless transmission or, in particular, by NFC transmission, to an external device (e.g. a NFC receiver, Bluetooth receiver, WLAN (Wireless Local Area Network) receiver, etc.).

Further, the electrical component 501 may be coupled to a passive device (resistor, impedance, capacitor) external to the electrical component 501 but internal of the current sensor device 500. By way of example, the second structured portion 21b of the first metal layer 21 may be shaped to form such passive device in the electrical redistribution structure 20. Byway of example, the second structured portion 21b may be shaped as a coil to form an inductor or an antenna. The antenna may, e.g., be used to transmit a wireless communication signal (e.g. NFC radio signal) and/or may serve as a device-internal inductive power supply to receive electromagnetic radiation power irradiated by an external power source. That way, by way of example, I/O external terminals of the current sensor device 500 may be omitted and/or external power supply terminals of the current sensor device 500 may be omitted. In general, the data transfer and/or the energy transfer of the electrical component 501 may be contactless.

For example in the field of "smart fusing", the electrical component 501 may be a power switch, a solid state relay, etc. E.g. in this case—but e.g. also in other cases—the power supply lines of the electrical component 501 may be connected to the first structured portion 21a of the first metal layer 21. By way of example, the electrical component 501 may be configured to switch the current in the first structured portion 21a (conductor). Further, the electrical component 501 may be configured to be galvanically separated from the second structured portion. That is, control connections (such as, e.g., a gate electrode) of such electrical component 501 (e.g. power switch transistor) may be designed to fulfill the galvanic separation criteria according to the requested voltage class, e.g. by contactless coupling such as, e.g., coreless coupling, etc. (see FIG. 10).

The electrical component 501 may e.g. be embedded in the encapsulant 30 the same way as the semiconductor chip 10 is embedded in the encapsulant 30. In particular, a lower surface of the electrical component 501 and the first main surface 30a of the encapsulant 30 may form a common planar surface.

Figure 6:
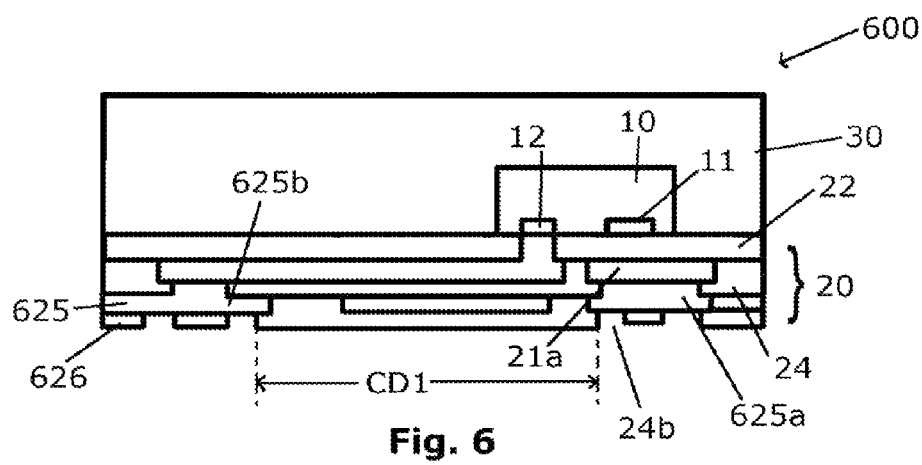
FIG. 6 schematically illustrates a cross-sectional view of an exemplary current sensor device including a multiple metal layer (electrical) redistribution structure.

FIG. 6 illustrates an exemplary current sensor device 600 which may be identical to current sensor devices 100, 500 as described above in view of the semiconductor chip 10, the organic insulating layer 22, the first metal layer 21, the first polymer layer 24, the encapsulant 30 and, e.g., the electrical component 501 (not illustrated in FIG. 6). However, the redistribution structure 20 as shown in FIG. 6 further comprises a second metal layer 625 and a second polymer layer 626. The second metal layer 625 may be applied on the lower surface of the first polymer layer 24 and the second polymer layer 626 may be applied on the lower surface of the second metal layer 625.

The second polymer layer 626 may be designed similar or identical to the first polymer layer 24 as shown in FIGS. 1 to 5, i.e. may form a solder stop layer of the current sensor device 600. The second metal layer 625 may have a second structured portion 625b on the low voltage side of the current sensor device 500 serving to provide exposed areas for external terminals similar to the second structured portion 21b. The second metal layer 625 may further comprise a first structured portion 625a which may be deposited on the first structured portion 21a of the first metal layer 21. Thus, the conductor for carrying the measuring current is effectively formed by a stack of two structured portions 21a, 625a of adjacent metal layers 21, 625 included in the redistribution structure 20. To that end, the first polymer layer 24 may have one or more openings 24b to expose a lower surface of the first structured portion 21a of the first metal layer 21 before the second metal layer 625 is deposited.

The multiple redistribution structure 20, as illustrated by way of example in FIG. 6, may be manufactured by conventional redistribution structure manufacturing processes, e.g. by the generation of polymer layers and metal layers in alternating order, by producing openings in the polymer layer(s) and by structuring the metal layer(s). The reinforcement of the conductor implemented in the electrical redistribution structure 20 is simply obtained by connecting adjacent metal layers via through-connections. In a multiple redistribution structure coreless transformers for control electrodes as described above might be realized in a simple manner.

This principle of increasing the sectional area of the conductor by stacking a plurality of structured portions of metal layers one over the other may also be extended to redistribution structures 20 containing more than two metal layers. Concurrently, redistribution structures 20 having multiple metal layers may e.g. be used to incorporate an increasing number of passive components e.g. inductor, antenna, capacitor, coreless transformer, etc., if desired.

Figure 7:
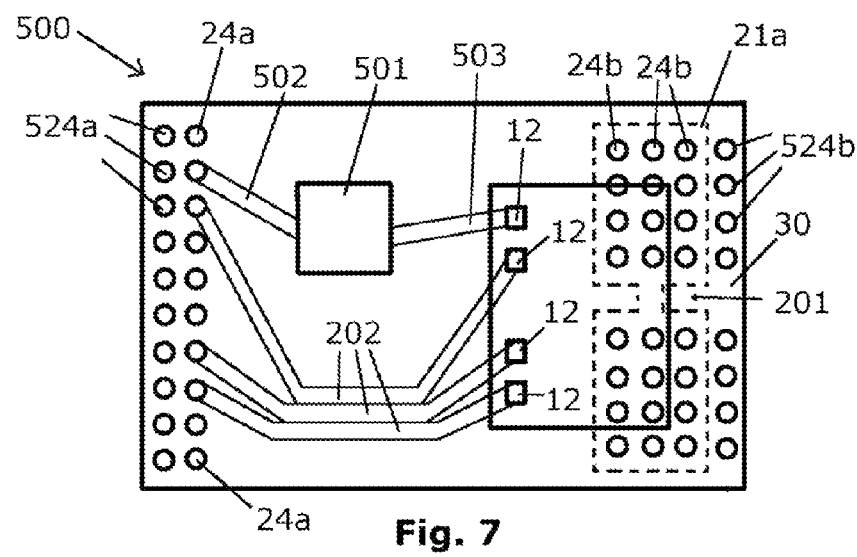
FIG. 7 schematically illustrates a top view of a current sensor device including an electrical component in a semi-transparent representation.

FIG. 7 illustrates a top view of, e.g., the current sensor device 500 as shown in FIG. 5. As it is apparent from FIG. 7, the electrical component 501 may be located in a zone surrounded by the U-shaped conductor paths 202. The electrical component 501 may be electrically coupled by conductor path(s) 502 to external terminals (located e.g. at openings 24a) and may be electrically coupled by e.g. conductor path(s) 503 to electrode(s) 12 of the semiconductor chip 10.

As exemplified in FIG. 7, the current sensor device 500 may optionally be provided with first dummy external terminals (e.g. solder balls) 524a on the low voltage side and/or second dummy external terminals 524b on the high voltage side of the device. By way of example, the first dummy external terminals 524a may be arranged in a column running along an edge of the encapsulant 30. Likewise, the second dummy external terminals 524b may be arranged in a column running along an opposite edge of the encapsulant 30. By way of example, the dummy external terminals 524a, 524b may be arranged on the edges of the package. The dummy external terminals 524a, 524b may have no electrical function. They may serve exclusively as mechanical support points arranged laterally outside of the functional external terminals located, e.g., at openings 24a, 24b to decrease thermo-mechanical loading acting on the functional external terminals when connected (e.g. soldered) to an application board. As to further aspects of implementation, the disclosure in conjunction with FIG. 2 applies to current sensor device 500 shown in FIG. 7, and reference is made to the corresponding description to avoid reiteration.

Figure 8:
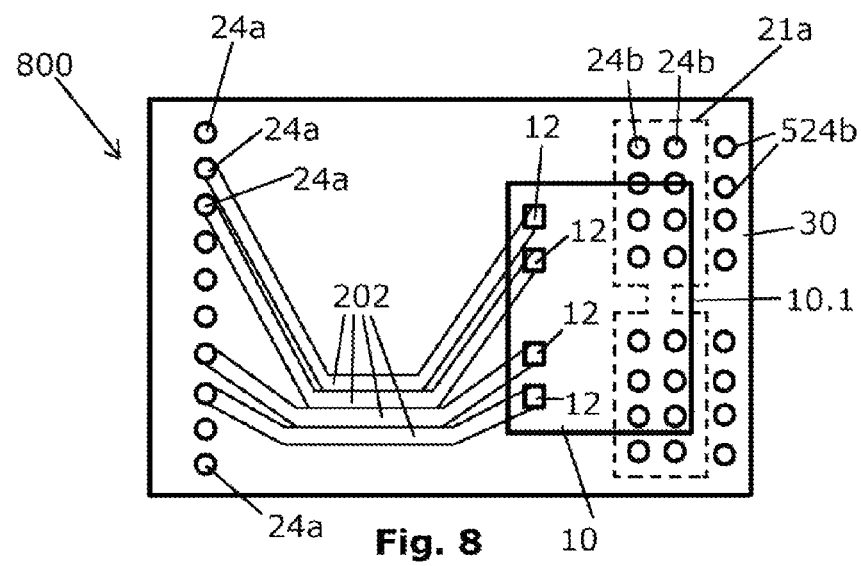
FIG. 8 schematically illustrates a top view of a current sensor device including a current conductor arranged within outlines of the semiconductor chip in a semi-transparent representation.

FIG. 8 schematically illustrates a top view of a current sensor device 800 depicted in a semi-transparent fashion. The current sensor device 800 may be similar to current sensor devices 100, 300, 400, 500, 600, as described before, and reference is made to the corresponding disclosure herein. However, in FIG. 8, the first structured portion 21a of the first metal layer 21 and thus, the conductor, does not project over the outline 10.1 of the semiconductor chip 10 in the direction of the length L of the current sensor device 800. Again, the conductor comprises the first structured portion 21a of the first metal layer 21, is incorporated in the electrical redistribution structure 20 and may be designed in accordance with one of the implementations described above.

Figure 10:
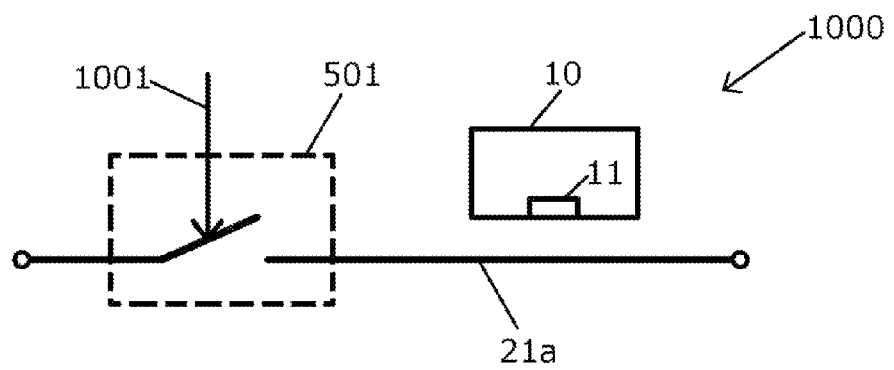
FIG. 10 schematically illustrates a circuit diagram of an exemplary current sensor device configured as a switch.

A circuit diagram of an exemplary current sensor device 1000 configured as a switch is schematically illustrated in FIG. 10. As depicted, the electrical component 501 switches the current flowing through the conductor (of which the first structured portion 21a of the first metal layer 21 at least forms a part of). A control connection 1001 of the switch, which is included in the electrical component 501, may be galvanically separated to the high voltage side of the current sensor device. The design of the current sensor device 1000 may be similar to current sensor devices 100, 300, 400, 500, 600, 800, however, with the specialty that the electrical component 501 is electrically connected to the high voltage side rather than to the low voltage side of the current sensor device 1000. The galvanic separation to the low voltage side may be established by contactless techniques (e.g. optical, coreless transformer or NFC data transfer).

Implementations and features explained by way of current sensor devices 100, 300, 400, 500, 600, 800, 1000 may be combined if not explicitly stated to the contrary. In particular, in all implementations the sensor chip 10 and/or the electrical component 501 may partly or completely be embedded in the encapsulant 30. In all implementations the organic insulating layer 22 may provide for the high voltage galvanic insulation, e.g. both in the horizontal and/or in the vertical direction. In all implementations the conductor may be generated by electroless plating, sputtering and/or electroplating (semi-additive or subtractive) during the generation of the redistribution structure 20, e.g. on artificial wafer level (see FIGS. 9A to 9K). Further, in all implementations electrode(s) 12 of the semiconductor chip 10 may be connected to the redistribution structure 20 and, e.g., to the same metal layer of the redistribution structure 20 which is used to at least partly form the conductor at the high voltage side.

Briefly put, standard packaging technology (embedding technology and/or RDL technology) may be used both for current sensor packaging (encapsulant 30, electrical interconnect at the lower and the higher voltage side of the sensor device) and, concurrently, for forming the conductor carrying the measuring current as part of the electrical redistribution structure 20.

FIGS. 9A to 9K schematically illustrate cross-sectional views of stages of an exemplary process to manufacture a current sensor device, e.g. current sensor device 100. The exemplary process is an eWLB (embedded Wafer Level Ball Grid) process.

Figure 9A:
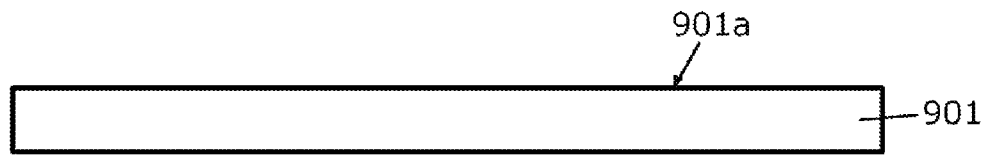
FIGS. 9A-9K schematically illustrate cross-sectional views of an exemplary process of a method of manufacturing a current sensor device.

First, a temporary carrier 901 is provided as illustrated in FIG. 9A. The temporary carrier 901 may be a plate made of a rigid material, for example metal, silicon, glass or plastics. The temporary carrier 901 may have a flat surface 901a. By way of example, an adhesive tape (not shown) may be provided on the flat surface 901a. Alternatively, a glue material or any other adhesive or mechanical securing means (e.g. a clamping device or a vacuum generator) may be associated with the flat surface 901a of the temporary carrier 901.

Figure 9B:
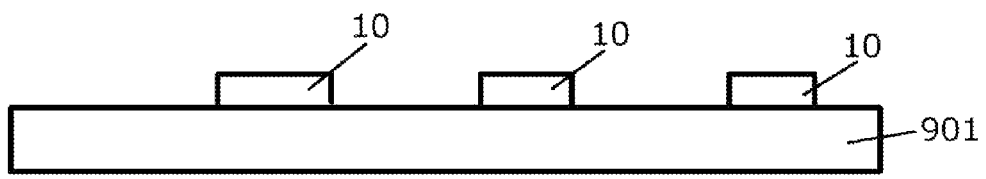

As illustrated in FIG. 9B, semiconductor chips 10 are placed on the temporary carrier 901. The semiconductor chips 10 are fixed on the surface 901a by the adhesive tape (not shown) or other appropriate equipment. The semiconductor chips 10 are placed on the temporary carrier 901 in a spaced-apart relationship. The distance between neighbouring semiconductor chips 10 may be in the range of the length L of the current sensor device 100 described herein. If electrical components 501 are to be integrated in the current sensor device 100 as previously described herein, these electrical components 501 (not shown in FIG. 9B) are also placed on the temporary carrier 901 next to the semiconductor chips 10. The semiconductor chips 10 may be placed on the temporary carrier 901 with the first main surface 10a facing the surface 901a of the temporary carrier. The first main surface 10a typically forms the active surface of the semiconductor chips 10.

Figure 9C:
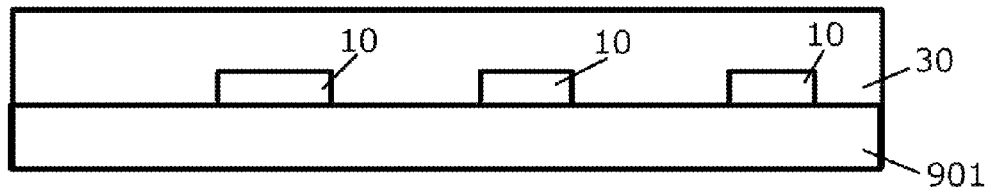

An encapsulation material (e.g. laminate material or a mold material) forming the encapsulant 30 may be applied to the semiconductor chips 10 and the temporary carrier 901 as shown in FIG. 9C. The encapsulant 30 may embed the semiconductor chips 10 except their first main surfaces 10a. If applied by molding, various techniques may be employed to cover the semiconductor chips 10 with the encapsulation material. The encapsulation material (in the case of mold material) may, for example, be applied by compression molding, injection molding, granulate molding, powder molding, or liquid molding.

The process of applying the encapsulation material (e.g. laminating or molding) may be accompanied by the application of heat, radiation and/or pressure. After curing, the encapsulant 30 is rigid and forms a sheet-like body (sometimes referred to as "artificial wafer"). FIGS. 9A to 9K only display a partial section of such a sheet-like body, that is to say in practice, typically much more than three semiconductor chips 10 are placed on the temporary carrier 901. The larger the lateral size of the sheet-like body and the number of embedded semiconductor chips 10, the more cost efficient the process will typically be.

Figure 9D:
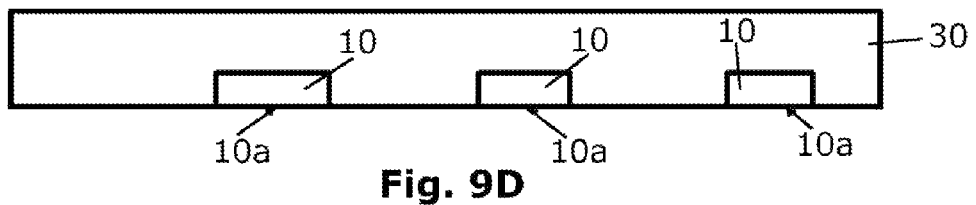

In FIG. 9D the encapsulant 30 is released from the temporary carrier 901. To this end, the adhesive tape (not shown) may feature thermo-release properties, which allow the removal of the temporary carrier 901 and e.g. the adhesive tape during a heat treatment. The first main surfaces 10a of the semiconductor chips 10 may be exposed at the first main surface 30a of the encapsulant 30. The first main surfaces 10a of the semiconductor chips 10 may level with the first main surface 30a of the encapsulant.

Figure 9E:
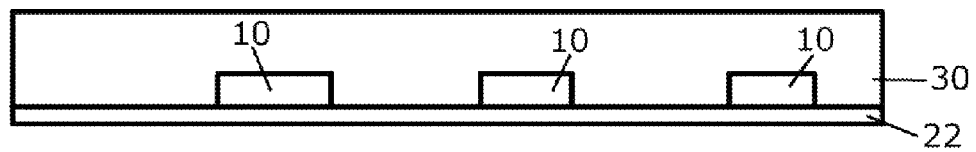

As shown in FIG. 9E, the organic insulating layer 22 may then be applied to this common planar surface. The organic insulating layer 22 may, e.g., be applied directly on the common planar surface. The organic insulating layer 22 may, e.g., be applied by spin coating, lamination or other appropriate processes. The organic insulating layer 22 may completely cover the first main surfaces 10a of the semiconductor chips 10 and the first main surface 30a of the encapsulant 30.

Figure 9F:
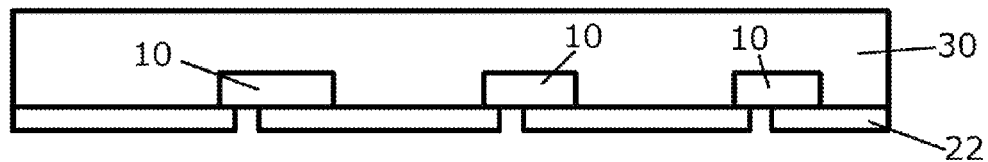

As shown in FIG. 9F, the organic insulating layer 22 may be structured to form openings for the through-connections 23 shown in FIG. 1. Structuring of the organic insulating layer 22 may be performed by a mask process (photolithography) or by laser ablation depending, e.g. on whether or not the material of the organic insulating layer 22 is photosensitive or not.

Figure 9G:
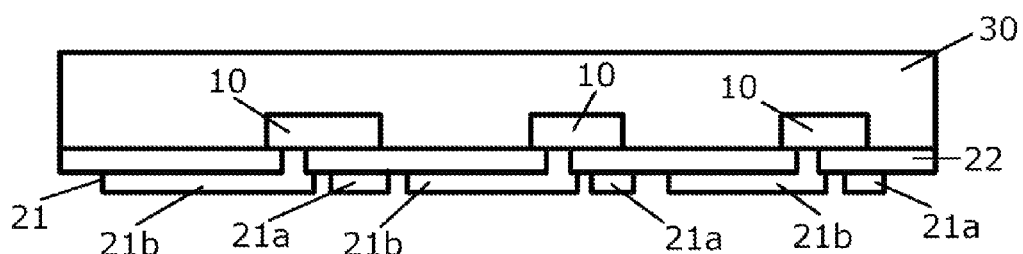

As shown in FIG. 9G, the first metal layer 21 may be applied, e.g. directly, on the organic insulating layer 22. The first metal layer 21 may be structured as illustrated in FIG. 9G. Byway of example, a sputtering technique may be used to deposit the first metal layer 21 on the organic insulating layer 22. It is also possible that the first metal layer 21 may be formed by galvanic deposition. In this case, a bottom seed layer (not shown) made of an appropriate material (e.g. zinc, titanium, chrome, palladium, etc.) is first deposited onto the exposed surface of the organic insulating layer 22. The seed layer may then be masked by lithographic techniques. The unmasked portions of the masked seed layer may then be employed as an electrode during galvanic deposition of the metallic material. That way, copper or other metals or metal alloys may be plated onto the seed layer in the unmasked portions and to the desired height. As shown in FIG. 9G, the first structured portions 21a and the second structured portions 21b may be obtained that way.

During this process of forming the structured first metal layer 21, it is possible to reinforce the first structured portions 21a to have a thickness greater than the thickness of the second structured portions 21b as described above. Byway of example, this could be achieved by masking the second structured portions 21b when a desired thickness for the second structured portions 21b is reached, and then by continuing the process of galvanic deposition at the unmasked areas of the first metal layer, e.g. at the first structured portions 21a. As known in the art, galvanic deposition allows for generating insular first and second structured portions 21a, 21b which are not electrically connected (e.g. by ultimately removing the masked seed layer areas when the galvanic deposition process has been completed).

Figure 9H:
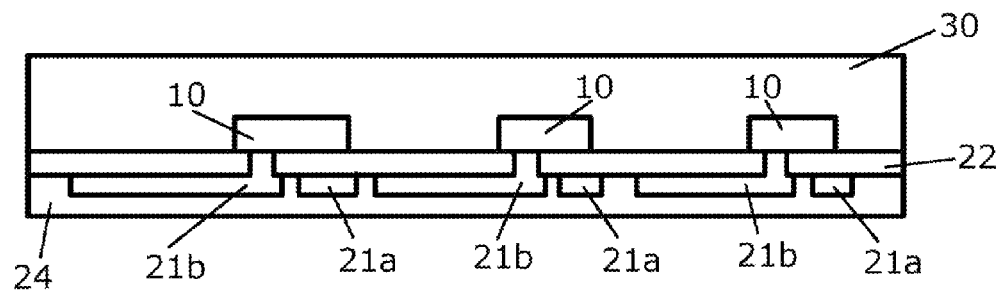

As shown in FIG. 9H, the first polymer layer 24 may then be deposited on top of the first metal layer 21. The first polymer layer 24 may, e.g., be deposited from a gas phase or from a solution, or can be laminated onto the surface topology. Moreover, thin film technology methods or a standard PCB (printed circuit board) industrial process flow can be used for the application of the first polymer layer 24. The first polymer layer 24 is configured and structured (in view of its layout) to ensure the creepage distance CD1 is in accordance with the designated voltage class.

Figure 9I:
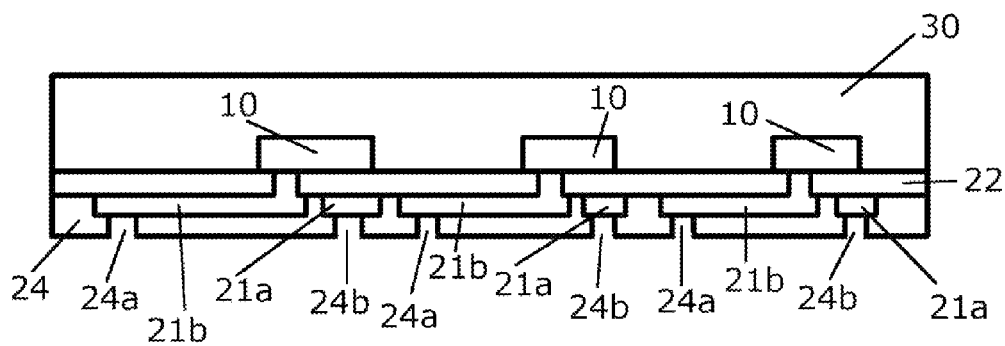

FIG. 9I illustrates the formation of openings 24a in the first polymer layer 24 at the low voltage side and openings 24b in the first polymer layer 24 at the high voltage side of the current sensor devices 100 to be manufactured. These openings 24a, 24b in the first polymer layer 24 may, e.g., be formed by photolithography, laser ablation or other technologies.

The processes described above in conjunction with FIGS. 9G to 9I may be repeated a desired number of times to produce an redistribution structure 20 of multiple metal and multiple polymer layers. As described above, multiple metal layers may be used to establish a current conductor of increasing thickness, see FIG. 6.

Figure 9J:
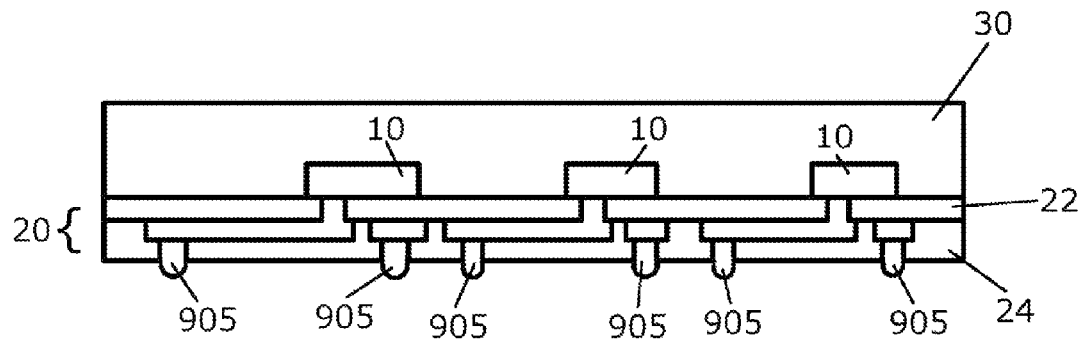

Solder deposits (e.g. solder balls) 905 may then be placed onto the uppermost structured metal layer as shown in FIG. 9J. The solder deposits 905 may be applied by so-called "ball placement" in which pre-shaped balls composed of solder material are applied to the first and second structured portions 21a, 21b at the positions defined by the openings 24a, 24b in the first polymer layer 24, respectively. The solder deposits 905 form external terminals of the current sensor devices 100 to electrically and mechanically mount the current sensor devices 100 to external circuitry such as, e.g., customer's application boards. The external terminals may comprise I/O terminals, power supply terminals and measuring current conductor terminals. As mentioned before, I/O terminals and/or power supply terminals may be omitted if contact-free external signal transmission and/or power supply is provided.

Figure 9K:
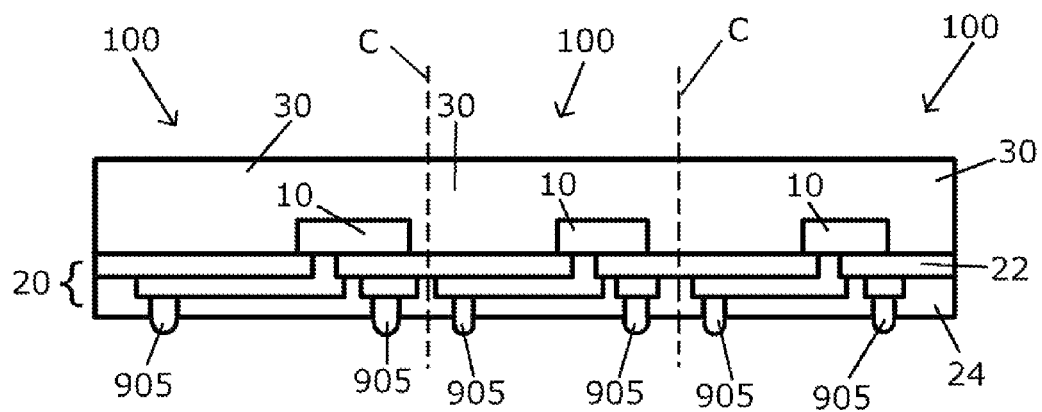

As illustrated in FIG. 9K, the current sensor devices 100 are then separated from one another by, for example, sawing, cutting, etching, or laser beam dicing along separation lines C.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A current sensor device for sensing a measuring current, comprising:
   a semiconductor chip comprising a magnetic field sensitive element;
   an encapsulant embedding the semiconductor chip;
   a conductor configured to carry the measuring current, the conductor being electrically insulated from the magnetic field sensitive element; and
   a redistribution structure comprising a first metal layer, a second metal layer and a polymer layer extending between the first metal layer and the second metal layer, the first metal layer, the polymer layer and the second metal layer each extending in a horizontal direction, the first metal layer comprising a first structured portion which forms part of the conductor, the second metal layer comprising a third structured portion connected in a vertical direction through an opening in the polymer layer to the first structured portion and forming part of the conductor,
   wherein the first structured portion of the first metal layer and the third structured portion of the second metal layer are positioned below the magnetic field sensitive element and at least partially overlapping with the magnetic field sensitive element.

2. The current sensor device of claim 1, wherein the first metal layer further comprises:
a second structured portion forming an electrical interconnect configured to electrically couple input/output electrodes or power supply electrodes of the semiconductor chip to external terminals of the current sensor device.

3. The current sensor of claim 2, wherein the redistribution structure further comprises:
an organic insulating layer extending between the semiconductor chip and the first metal layer of the redistribution structure, and wherein
a vertical break through voltage of the organic insulating layer is in the range of ⅓ to 3 times of a horizontal break through voltage between the first structured portion and the second structured portion.

4. The current sensor device of claim 1, wherein the redistribution structure further comprises:
an organic insulating layer extending between the semiconductor chip and the first metal layer of the redistribution structure.

5. The current sensor device of claim 1, wherein:
the semiconductor chip has a first main surface and a second main surface,
the encapsulant has a first main surface and a second main surface;
the first main surface of the semiconductor chip and the first main surface of the encapsulant face the redistribution structure; and
the first main surface of the semiconductor chip and the first main surface of the encapsulant form a common planar surface.

6. The current sensor device of claim 1, wherein the first structured portion has a thickness equal to a thickness of the first metal layer outside of the first structured portion.

7. The current sensor device of claim 1, further comprising:
an electrical component electrically coupled to the redistribution structure.

8. The current sensor device of claim 7, wherein the electrical component is a switch operable to control the current in the first structured portion of the first metal layer.

9. The current sensor device of claim 8, wherein the first metal layer further comprises:
a second structured portion forming an electrical interconnect configured to electrically couple input/output electrodes or power supply electrodes of the semiconductor chip to external terminals of the current sensor device, wherein the electrical component is galvanically separated from the second structured portion.

10. The current sensor device of claim 7, wherein the electrical component is a passive device comprising one or more devices selected from the group consisting of a resistor, a capacitor, an inductor, and an integrated passive device (IPD) chip.

11. The chip package of claim 7, wherein the electrical component is an active device comprising one or more devices selected from the group consisting of a controller, a microprocessor, and a chip for wireless communication.

12. The current sensor device of claim 7, wherein the electrical component is electrically coupled to a structured portion of a metal layer of the redistribution structure which is configured as a resistor, a capacitor, an inductor or an antenna.

13. The current sensor of claim 7, wherein data transfer and/or energy transfer of the electrical component is contactless.

14. The current sensor device of claim 1, wherein the conductor comprises a constriction, the constriction being disposed beneath and overlapping the magnetic field sensitive element.

15. The current sensor device of claim 1, wherein the opening in the polymer layer is positioned below the magnetic field sensitive element and at least partially overlapping the semiconductor chip.

16. A current sensor device for sensing a measuring current, comprising:
a semiconductor chip having a first main surface containing a magnetic field sensitive element; and
a redistribution structure extending over the first main surface of the semiconductor chip, the redistribution structure comprising a first metal layer comprising a first structured portion configured to form a conductor for carrying the measuring current, an organic insulating layer extending between the first main surface of the semiconductor chip and the conductor, a second metal layer comprising a third structured portion, and a polymer layer extending between the first metal layer and the second metal layer,
wherein the first metal layer, the polymer layer and the second metal layer each extend in a horizontal direction,
wherein the third structured portion is connected in a vertical direction through an opening in the polymer layer to the first structured portion and forming part of the conductor,
wherein the first structured portion of the first metal layer and the third structured portion of the second metal layer are positioned below the magnetic field sensitive element and at least partially overlapping with the magnetic field sensitive element.

17. The current sensor device of claim 16, wherein the first main surface of the semiconductor chip further comprises at least one chip electrode, and wherein the at least one chip electrode is electrically coupled to an external terminal of the current sensor device via an electrical interconnect formed by the redistribution structure.

18. The current sensor device of claim 17, wherein the electrical interconnect comprises a second structured portion of the first metal layer.

19. The current sensor device of claim 18, further comprising:
an electrical component configured to switch the current in the first structured portion and galvanically separated from the second structured portion.

* * * * *